US007417018B2

(12) United States Patent
Michaud et al.

(10) Patent No.: US 7,417,018 B2
(45) Date of Patent: Aug. 26, 2008

(54) METHOD OF CLEANING A SOLID SURFACE BY REMOVING ORGANIC AND/OR MINERAL SOILS USING A MICROEMULSION

(75) Inventors: Pascal Michaud, Saint-Gratien (FR); Jean-Claude Lheureux, Montgeron (FR)

(73) Assignee: ATOFINA, Puteaux (FR)

( * ) Notice: Subject to any disclaimer, the term of this patent is extended or adjusted under 35 U.S.C. 154(b) by 196 days.

(21) Appl. No.: 10/250,914

(22) PCT Filed: Jan. 7, 2002

(86) PCT No.: PCT/FR02/00035

§ 371 (c)(1), (2), (4) Date: Dec. 29, 2003

(87) PCT Pub. No.: WO02/055223

PCT Pub. Date: Jul. 18, 2002

(65) Prior Publication Data

US 2004/0092420 A1 May 13, 2004

(30) Foreign Application Priority Data

Jan. 9, 2001 (FR) .................................. 01 00228

(51) Int. Cl.
*H01L 21/00* (2006.01)

(52) U.S. Cl. .......................... 510/417; 134/2; 134/25.4; 134/26; 134/902

(58) Field of Classification Search ................. 510/417; 134/2, 25.4, 26, 902
See application file for complete search history.

(56) References Cited

U.S. PATENT DOCUMENTS

| | | | | | |
|---|---|---|---|---|---|
| 4,650,493 | A | * | 3/1987 | Pahlsson et al. | 8/142 |
| 4,956,115 | A | * | 9/1990 | Van De Mark | 510/206 |
| 4,975,468 | A | * | 12/1990 | Yiv | 514/759 |
| 5,196,136 | A | * | 3/1993 | Dishart et al. | 510/413 |
| 5,213,624 | A | * | 5/1993 | Williams | 134/40 |
| 5,514,301 | A | * | 5/1996 | Bil et al. | 510/365 |
| 5,571,337 | A | * | 11/1996 | Mohindra et al. | 134/7 |
| 5,597,792 | A | * | 1/1997 | Klier et al. | 510/417 |
| 5,634,978 | A | * | 6/1997 | Mohindra et al. | 134/2 |
| 5,727,578 | A | * | 3/1998 | Matthews | 134/61 |
| 5,888,308 | A | * | 3/1999 | Sachdev et al. | 134/1 |
| 5,908,822 | A | * | 6/1999 | Dishart | 510/467 |
| 5,911,837 | A | * | 6/1999 | Matthews | 134/2 |
| 5,938,856 | A | * | 8/1999 | Sachdev et al. | 134/1.3 |
| 6,030,754 | A | * | 2/2000 | Atnip | 430/329 |
| 6,090,901 | A | * | 7/2000 | Bowers et al. | 526/277 |
| 6,120,613 | A | * | 9/2000 | Romack et al. | 134/10 |
| 6,159,827 | A | * | 12/2000 | Kataoka et al. | 438/464 |
| 6,159,917 | A | * | 12/2000 | Baran et al. | 510/291 |
| 6,165,962 | A | * | 12/2000 | Kaler et al. | 510/365 |
| 6,730,595 | B2 | * | 5/2004 | Saimoto et al. | 438/654 |
| 7,131,217 | B2 | * | 11/2006 | Kim et al. | 34/630 |
| 2002/0106868 | A1 | * | 8/2002 | Saimoto et al. | 438/459 |
| 2003/0097718 | A1 | * | 5/2003 | Evers et al. | 8/142 |
| 2003/0148911 | A1 | * | 8/2003 | Smith et al. | 510/417 |
| 2003/0171242 | A1 | | 9/2003 | Pascal | |
| 2005/0037200 | A1 | * | 2/2005 | Wallach | 428/402.2 |

* cited by examiner

*Primary Examiner*—Gregory E Webb
(74) *Attorney, Agent, or Firm*—Millen, White, Zelano & Branigan, P.C.

(57) ABSTRACT

The invention relates to a method of cleaning a solid surface comprising the following stages: a) the solid surface is cleaned using a microemulsion-type cleaning composition; e) the cleaned surface is drained; f) the drained surface is rinsed with an organic solvent or a mixture of organic solvents with a low boiling point; and g) said surface which was rinsed with the organic solvent or the mixture of organic solvents used in c) is then dried.

22 Claims, No Drawings

METHOD OF CLEANING A SOLID SURFACE BY REMOVING ORGANIC AND/OR MINERAL SOILS USING A MICROEMULSION

This invention relates to a cleaning process, more particularly it relates to a process for elimination of organic and/or mineral marks from a solid surface (or substrate).

In electrical, electronic, optical and mechanical industries in particular, it is necessary to eliminate completely the mineral and/or organic marks from pieces or materials of products that are finished or that have to undergo subsequent transformation stages.

Traditionally, these surfaces were cleaned with 1,1,1-trichloroethane, a very polyvalent solvent, but which had been condemned by the protocol of Montreal because of its impact on the ozone layer.

It is also known to use cleaning compositions that come in the form of microemulsions that are stable at ambient temperature as described in Patent Application FR 2 795 088 that exhibit the advantage of eliminating both the organic and mineral marks because they combine a solvent portion and a mineral portion.

It is necessary, however, to carry out a rinsing with water of the treated surface with said microemulsion-type compositions and, in the above-mentioned technical fields, the surfaces should be not only free of any mineral and/or organic marks but also completely rid of water.

A cleaning process that makes it possible to eliminate all organic and/or mineral marks and the traces of water from a solid surface (or substrate) has now been found, characterized in that it comprises the following stages.

a) Cleaning of said solid surface with a microemulsion-type cleaning composition,
b) Draining of said cleaned surface,
c) Rinsing of said drained surface with an organic solvent or a mixture of organic solvents with a low boiling point, and
d) Drying of said rinsed surface with the organic solvent or the mixture of organic solvents used in c).

The microemulsion-type cleaning composition that is used according to the invention offers the advantage of being able to eliminate effectively any organic and/or mineral marks from the solid surface that is to be cleaned.

A preferred microemulsion-type cleaning composition is described in Patent Application FR2 795 088.

It comprises in particular:

(A) 30 to 70 parts by weight, in particular 35 to 60 parts by weight, of water;
(B) 20 to 60 parts hy weight, in particular 25 to 55 parts by weight of at least one liquid organic solvent at ambient temperature; and
(C) 5 to 30 parts by weight, in particular 10 to 25 parts by weight, of at least one surfactant of Formula (I):

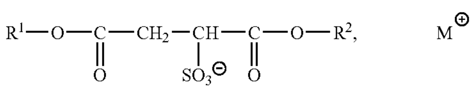

(I)

in which:

$R^1$ and $R^2$ each independently represent a linear or branched alkyl radical of $C_5$-$C_{20}$;

M is a cation that is selected from among $Na^{(+)}$, $K^{(+)}$ and $NR_4^{(+)}$, whereby the Rs each independently represent hydrogen or an alkyl radical of $C_1$-$C_4$; whereby (A) + (B)+(C) represent 100 parts by weight.

Cleaning stage a) can be carried out in an immersion tank or a shower bath in combination with ultrasonic waves, vibrations or mechanical shaking.

The microemulsion-type cleaning composition will be used at a temperature that ranges from ambient temperature (about 20° C.) to 60° C. and preferably at a temperature of between 20° C. and 40° C.

The cleaning period of the solid surface—stage a)—is based on the type of mark and its adhesion to the solid surface.

This cleaning period does not exceed 5 minutes and preferably is between 1 and 3 minutes.

Organic solvent or solvents (B) that is/are contained in the microemulsion-type cleaning composition that is used in stage a) is/are selected preferably from among the aliphatic hydrocarbons, the alkylene glycol monoethers, and the dialkylene glycol monoethers.

The aliphatic hydrocarbons can be linear, branched, or cyclic hydrocarbons or combinations thereof. They contain in particular 3 to 24 carbon atoms, preferably 6 to 24 carbon atoms. Examples of aliphatic hydrocarbons that are commercially available are:

NORPAR™ 12, 13 and 15 (normal paraffinic solvents that are available from the company "EXXON CORPORATION");

ISOPAR™ G, H, K, L, M, V (isoparaffinic solvents that are available from the company "EXXON CORPORATION");

The SHELLSOL™ solvents (available from the company "SHELL CHEMICAL COMPANY");

The PETROSOLV™ of CEPSA D-15/20, D-19/22, D-20/26, D-24/27, D-28/31 (paraffinic and isoparaffinic solvents that are available from the company "CEPSA");

The EXXSOL™ hydrocarbon-containing solvents that are marketed by the company "EXXON CORPORATION";

The kerosene fractions such as KETRUL 211, 212, D80, D85, marketed by the TOTALFINAELF Company.

The monoethers of alkylene glycols can be in particular propylene glycol monoethers of $C_4$-$C_{25}$, such as propylene glycol monomethyl ether (PM), propylene glycol monoethyl ether (PR). propylene glycol mono-n-propyl ether (PNP), propylene glycol mono-tert-butyl ether (PTB), propylene glycol mono-n-butyl ether (PNB), and propylene glycol mono-hexyl ether.

The dialkylene glycol monoethers can be, for example, dipropylene glycol monomethyl ether (DPM), dipropylene glycol mono-n-propyl ether (DPNP), dipropylene glycol mono-tert-butyl ether (DPTB), dipropylene glycol mono-n-butyl ether (DPNB), and dipropylene glycol monohexyl ether; and diethylene glycol n-butyl ether (butyl diglycol ether-BDG), diethylene glyco) hexyl ether and diethylene glycol octyl ether.

The composition that can be used according to the invention can also contain:

at least one sequestering agent, such as ethylene diamine tetraacetic acid (EDTA) and its salts, at a rate in particular of 0.01 to 0.1 part by weight per 100 parts by weight of (A)+(B)+(C); and/or at least one anti-corrosion agent that is selected in particular from among the RCOOH-type organic acids, whereby R is a hydrocarbon-containing radical of $C_4$-$C_{24}$, and the amines, at a rate of in particular 0.01 to 0.5 part by weight per 100 parts by weight of (A)+(B)+(C); and/or at least one additive in the usual amounts, selected from among the disinfectants, the fungicides (quaternary ammonium salts), and the biocides (organic peroxides, hydrogen peroxide, compounds with active halogen, phenolic inorganic salts, quaternary ammonium salts, organometallic derivatives, organo-sulfur derivatives); and/or at least one perfume.

The cleaned solid surface is subjected to a draining stage b) that consists in withdrawing said cleaned solid surface from the cleaning composition and in draining it at ambient temperature for a period that ranges from 30 seconds to 1 minute.

Finally, the drained solid surface is subjected to a rinsing stage c) that is carried out with an organic solvent or a mixture of organic solvents, inert, preferably non-inflammable and with a low boiling point.

This rinsing stage is carried out at a temperature that is less than 10 to 15° C., preferably less than 5° C., of the boiling point of the organic solvent or the most volatile compound from the mixture of organic solvents used for said rinsing stage.

Concerning mixtures of organic solvents, most particularly azeotropic mixtures or quasi-azeotropic mixtures will be used.

Organic solvent or a mixture of organic solvents of a low boiling point is currently defined as an organic solvent or a mixture of organic solvents that have a boiling point that is at most equal to 90° C. and preferably between 25° C. and 70° C.

The organic solvent or the mixture of organic solvents can be selected in particular from among:

- The aliphatic alcohols such as methanol, ethanol, isopropanol, or butanol,
- The aliphatic esters such as ethyl acetate, butyl acetate, or methyl formate;
- The branched or cyclic linear saturated hydrocarbons that contain 5 to 7 carbon atoms, such as: pentane, hexane, heptane, cyclopentane, and cyclohexane,
- The aliphatic ketones such as acetone, and methylethylketone;
- The aliphatic ethers such as tetrahydrofuran (THF), diethyl ether, dipropyl ether, and dibutyl ether,
- The acetals such as dimethoxymethane (methylal);
- The halogen-containing aliphatic hydrocarbons such as methylene chloride, trichloroethylene, perflouroalkanes $C_nF_{2n+2}$ with n ranging from 4 to 8, hydrofluorocarbons (HFC) such as 1,1,1,2,3,4,4,5,5,5-decafluoropentane, (4310 mee), and 1,1,1,3,3-pentafluorobutane (365 mfc);
- Hydrofluorochlorocarbons (HCFC) such as 1,1-dichloro-1-fluoroethiane (141 b), hydrofluoroethers such as perfluoromethyl ether ($C_4F_9OCH_3$);

or the mixture of at least two of the above-mentioned compounds.

Azeotropic mixtures or quasi-azeotropic mixtures of at least two of the above-mentioned compounds will be used.

By way of illustration of such azeotropic or quasi-azeotropic mixtures that can be used according to this invention as rinsing solvents, there will be cited:

- The azeotropes that are mentioned in Patent Application FR 2 791 499-A1 such as the binary azeotrope 4310 mee/365 mfc (9/91), (the numbers between parentheses indicate the percentages by weight respectively of the components of the azeotrope), and the ternary azeotrope 4310 mee/365 mfc/$CH_3OH$ (12/83/5);
- The azeotropes that are mentioned in Patent Application FR 2 792 648 such as the binary azeotrope 4310 mee/trichloroethylene (89/11), the ternary azeotrope 4310 mee/trichloroethlylene/$CH_3OH$ (84.5/9.5/6), the ternary azeotrope 4310 mee/trichloroethylene/isopropanol (88, 2/9, 6/2, 2), and the ternary azeotrope 4310 mee/trichloroethylene/methylal (87/9/4);
- The azeotropes that are mentioned in Patent Application FR 2 792 649 such as the quaternary azeotrope 4310 mee/$CH_2Cl_2$/cyclopentane/$CH_3OH$ (47.5/32.7/17/2.8);
- The azeotropes that are mentioned in Patent Application FR 2 792 647 such as the quaternary azeotrope 365 mfc/$CH_2Cl_2$/$CH_3OH$/4310 mee (56.2/39.8/3.5/0.5);
- The azeotropes or quasi-azeotropes that are mentioned in Patent Application FR 2 766 836 such as the ternary quasi-azeotrope 365 mfc/$CH_2Cl_2$/$CH_3OH$ (89/7/4);
- The azeotropes that are mentioned in patent application Ser. No. FR 2 759 090 such as the binary azeotrope 4310 mee/$CH_2Cl_2$ (50/50).

Among all of these azeotropic mixtures most particularly preferred are the ternary azeotrope 4310 mee/365 mfc/$CH_3OH$ (12, 83, 5), the binary azeotrope 4310 mee/($CH_2Cl_2$ (50/50), the binary azeotrope 365 mfc/$CH_2Cl_2$ (56.6/43.4), the binary azeotrope 4310 mee/365 mfc (9/91), the ternary quasi-azeotrope 365 mfc/$CH_2Cl_2$/$CH_3OH$ (89/7/4), the binary azeotrope 141b/methanol (96/4), and the ternary azeotrope 365/$CH_2Cl_2$/$CH_3OH$ (57/39.5/3.5).

According to this invention, drying surge d) is carried out by exposing the rinsed solid surface to the vapor that is produced by heating the organic solvent or the mixture of organic solvents used in rinsing stage c). In the case of a mixture of non-azeotropic, solvents, the rinsed surface will be dried by the vapor of the most volatile compound.

The drying period is at least 20 seconds and preferably between 30 seconds and 1 minutes The process according to this invention pertains most particularly to the elimination of organic and/or mineral marks from the solid surfaces of metal pieces, ceramic pieces, glass pieces, plastic pieces, or printed circuits (electronic pieces, pieces of semi-conductors).

The process of this invention makes it possible to obtain clean solid surfaces that are free of any organic and/or mineral marks as well as traces of water. The pieces that are cleaned by means of the process according to the invention can be used immediately for other treatment operations, such as, for example, painting or electrodeposition.

The device for implementing the process according to the invention can consist of the sequence or the following devices:

- A first tank in which is carried out the cleaning of the solid surface with the microemulsion-type composition. This tank can be provided with heating means and means that make it possible to produce ultrasound. The piece (or pieces) to be cleaned, used on a basket, is immersed in a microemulsion-type composition bath at a temperature and for a period as defined above.
- The piece is then withdrawn from the bath and then drained, preferably above an inclined plane that makes possible the return of the microemulsion-type composition to the cleaning tank, then it is directed toward the rinsing/drying cycle.

The rinsing-drying stages are preferably carried out in an industrial machine that comprises at least two tanks that are provided with means for heating and condensation.

In a first tank, optionally equipped with means for ultrasound production, the rinsing of the piece is carried out by its immersion in a bath of organic solvent or a mixture of organic solvents that is brought to a temperature as defined above. Next, the piece is withdrawn from said bath and then conveyed to the second tank to be dried there. This second tank contains the organic solvent or the mixture of organic solvents that are used in the preceding rinsing tank that is brought to its boiling point.

The piece is therefore dried by the vapors of the organic solvent or the mixture of organic solvents that are used for the rinsing. These vapors are condensed by means of a condensation coil that is cooled and recycled in the liquid rinsing tank.

The following examples illustrate the invention.

Equipment:

Placed in a line are:

A cleaning tank that contains 5 liters of a microemulsion-type composition,

An inclined plane for draining the microemulsion with a return to the cleaning tank, and A B125-type 2-tank machine (marketed by the company BRANSON ULTRASONIC S.A.).

The diagram of the sequence is as follows:

→ Cleaning 1 minute → Draining 30 seconds → Rinsing 2 minutes Drying 30 seconds →

Pieces to be Cleaned:

A 3161 stainless steel plate measuring 100×100×1 mm is coated with MOBIL CUT 151 cutting oil or MOBIL 766 machining oil, A stainless steel grid measuring 100×100 (40 strands per cm) is coated by the same marks.

These plates and the grid are placed on a basket that carries out the sequence above.

Products that are Used:

Microemulsion-type cleaning composition (% expressed by weight)

Water: 42%

KETRUL 211 petroleum fraction: 32%

"EMPIMIN OP 070" surfactant that is marketed by the company "Albright and Wilson Iberica": 18%

Dipropylene glycol mono-n-butyl ether (DPNB): 8%

Anti-corrosion additives: 0.15% relative to the sum of water, petroleum fraction, surfactant, and DPNB, or:

Heptanoic acid (0.063%)

Undecylic acid (0.043.5%)

IRGAMET 42 (cyclic amine) (0.0435%)

Organic solvents or mixtures of organic solvents that are used are recorded in Table 1 below with their boiling points.

The cleaning sequence is carried out according to the diagram above on the plates and the grid that are coated by the marks mentioned above. The bath temperature of the cleaning tank is 40° C.

The rinsing temperature is equal to Te-5° C., whereby Te is the boiling point of the organic solvent, the azeotrope or else the quasi-azeotrope.

The results are recorded in Table 1.

| Test | Rinsing and Drying Solvent | Te (° C.) | Appearance of the Cleaned Plates and Grids |
|---|---|---|---|
| 1 | Azeotrope 4310 mec/365 mfc (9/91) | 36.5 | No longer exhibit any mark. The surfaces |
| 2 | Azeotrope 4310 mee/365 mfc/$CH_3OH$ (12/83/5) | 33.2 | are perfectly clean and dry. |
| 3 | Quasi-azeotrope 365 mfc/$CH_2Cl_2$/$CH_3OH$ (89/7/4) | 35.7 | |
| 4 | Azeotrope 4310 mcc/$CH_2Cl_2$ (50/50) | 34.2 | |
| 5 | $CH_2Cl_2$ stabilized | 40 | |
| 6 | 1,1-dichloro-1-fluoroethane azeotrope/methanol (96/4) | 29 | |
| 7 | Stabilized trichloroethylene | 86.7 | |
| 8 | Azeotrope 365 mfe/$CH_2Cl_2$/$CH_3OH$ (57/39/3.5) | 32.1 | |
| 9 | Azeotrope 365 mfc/$CH_2Cl_2$ (56.6/43.4) | 33.6 | |

The invention claimed is:

1. A process for cleaning a solid surface of an electronic component, said process comprising:

a) Cleaning said solid surface of an electronic component by means of a microemulsion-type cleaning composition, b) Draining said cleaned surface, c) Rinsing said drained surface with an organic solvent or a mixture of organic solvents with a low boiling point, consisting of aliphatic alcohols, aliphatic esters, branched or cyclic, linear saturated hydrocarbons that contain 5 to 7 carbon atoms; aliphatic ketones; aliphatic ethers; dimethoxymethane; methylene chloride, trichloroethylene, perflouroalkanes $C_nF_{2n+2}$ with n ranging from 4 to 8; hydrofluorocarbons (HFC), hydrofluorochlorocarbons or a mixture of at least two of the above-mentioned compounds, d) Drying said rinsed surface with the organic solvent or the mixture of organic solvents used in c).

2. The process according to claim 1, wherein the microemulsion-type cleaning composition is used at a temperature that ranges from ambient temperature to 60° C.

3. The process according to claim 1, wherein the cleaning period (stage a) does not exceed 5 minutes.

4. The process according to claim 1, wherein the draining period goes from 30 seconds to 1 minute.

5. The process according to claim 1, wherein rinsing stage c) is carried out at a temperature that is less than 10 to 15° C. from the boiling point of the organic solvent or the most volatile compound of the mixture of organic solvents used in said rinsing stage.

6. The process according to claim 1, wherein drying stage d) is carried out by exposing the rinsed solid surface to the vapor that is produced by heating the organic solvent or the mixture of organic solvents that are used in rinsing stage c).

7. The process according to claim 1, wherein the organic solvent or the mixture of organic solvents have a boiling point that is at most equal to 90° C.

8. The process according to claim 1, wherein the duration of drying stage d) is at least 20 seconds.

9. The process according to claim 1, wherein the micro-emulsion-type cleaning composition comprises:

(A) 30 to 70 parts by weight of water;

(B) 20 to 60 parts by weight of said at least one organic solvent, which is at ambient temperature; and (C) 5 to 30 parts by weight, in particular 10 to 25 parts by weight, of at least one surfactant of Formula (I):

(I)

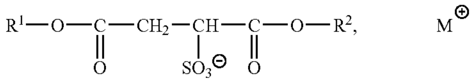

in which:

$R^1$ and $R^2$ each independently represent a linear or branched alkyl radical of $C_5$-$C_{20}$;

M is a cation that is selected from among $Na^{(+)}$, $K^{(+)}$ and $NR_4^{(+)}$, whereby the Rs each independently represent hydrogen or an alkyl radical of $C_1$-$C_4$; whereby (A)+(B)+(C) represent 100 parts by weight.

10. The process according to claim 9, wherein organic solvent or solvents (B) that is/are contained in the microemulsion-type cleaning composition that is used in stage a) consist of aliphatic hydrocarbons, alkylene glycol monoethers, or dialkylene glycol monoethers.

11. The process according to claim 1, wherein said organic solvents are azeotropic mixtures or quasi-azeotropic mixtures of the compounds that are mentioned.

12. The process according to claim 11, wherein the azeotropic mixtures or quasi-azeotropic mixtures that are used in stages c) and d) are the binary azeotrope 4310 mee /365 mfc (9/91), the ternary azeotrope 4310 mee/365 mfc/$CH_3OH$ (12/83/5); the ternary quasi-azeotrope 365 mfc/$CH_2Cl_2$/(50/50), the 1,1-dichloro-1-fluoroethane binary azeotrope/methanol (96/4), the ternary azeotrope 365 mfc/$CH_2Cl_2$/$CH_3OH$ (57/39.5/3.5), and the binary azeotrope 365 mfc/$CH_2Cl_2$ (56.6/43.4).

13. The process according to claim 1, wherein the micro-emulsion-type cleaning composition is used at a temperature of between 20° C. and 40° C.

14. The process according to claim 1, wherein rinsing stage c) is carried out at a temperature that is less than 5° C. from the boiling point of the organic solvent or the most volatile compound of the mixture of organic solvents used in said rinsing stage.

15. The process according to claim 1, wherein the organic solvent or the mixture of organic solvents have a boiling point of between 25° C. and 70° C.

16. The process according to claim 1, wherein the duration of drying stage d) is at least between 30 seconds and 1 minute.

17. The process according to claim 2, wherein the cleaning period (stage a)) does not exceed 5 minutes.

18. The process according to claim 14, wherein the organic solvent or the mixture of organic solvents have a boiling point that is at most equal to 90° C.

19. The process according to claim 16, wherein the duration of drying stage d) is at least 20 seconds.

20. The process according to claim 1, wherein the solid surface is a printed circuit.

21. A process according to claim 1, wherein the solvent in (C) is not isopropanol.

22. A process according to claim 1, wherein the organic solvent is methanol, isopropanol, ethyl acetate, 1,1,1,2,3,4,4,5,5,5-decafluoropentrane, 1,1,1,3,3-penotafluorobutane, 1,1-dichloro-1-fluoroethane, pefluoromethyl ether or a mixture of at least two thereof.

* * * * *